US011342934B2

(12) United States Patent
Hill et al.

(10) Patent No.: US 11,342,934 B2
(45) Date of Patent: *May 24, 2022

(54) REMOTE DOWNHOLE SIGNAL DECODER AND METHOD FOR SIGNAL RE-TRANSMISSION

(71) Applicant: 5 BY 5, LLC, Kingsley, MI (US)

(72) Inventors: Troy Hill, Spring, TX (US); Rishon Kimber, Houston, TX (US); Travis McDougall, Kingsley, MI (US)

(73) Assignee: 5 by 5, LLC, Traverse City, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/198,217

(22) Filed: Mar. 10, 2021

(65) Prior Publication Data

US 2021/0203353 A1    Jul. 1, 2021

Related U.S. Application Data

(63) Continuation of application No. 16/823,325, filed on Mar. 18, 2020, now Pat. No. 10,972,124.

(Continued)

(51) Int. Cl.
| | | |
|---|---|---|
| *H03M 7/00* | (2006.01) | |
| *H03M 7/30* | (2006.01) | |
| *H04L 67/12* | (2022.01) | |
| *H03M 1/66* | (2006.01) | |
| *E21B 47/13* | (2012.01) | |
| *H03M 1/12* | (2006.01) | |
| *G01V 3/30* | (2006.01) | |
| *G01V 3/26* | (2006.01) | |

(Continued)

(52) U.S. Cl.
CPC .......... *H03M 7/3064* (2013.01); *E21B 47/12* (2013.01); *E21B 47/13* (2020.05); *G01V 3/08* (2013.01); *G01V 3/18* (2013.01); *G01V 3/26* (2013.01); *G01V 3/30* (2013.01); *H03M 1/12* (2013.01); *H03M 1/66* (2013.01); *H03M 7/6005* (2013.01); *H04L 67/12* (2013.01)

(58) Field of Classification Search
CPC ... G01V 3/30; G01V 3/08; G01V 3/18; G01V 3/26; E21B 47/12; E21B 47/13; E21B 47/0228
USPC .......... 324/338, 339, 334; 340/855.7, 854.4; 702/6, 7
See application file for complete search history.

(56) References Cited

U.S. PATENT DOCUMENTS

| | | |
|---|---|---|
| 4,181,014 A | 1/1980 | Zuvela et al. |
| 6,456,902 B1 | 9/2002 | Streetman |

(Continued)

FOREIGN PATENT DOCUMENTS

WO     2017174750     10/2017

*Primary Examiner* — Joseph J Lauture
(74) *Attorney, Agent, or Firm* — Gary P. Katz; Katz Law Group, LLC

(57) ABSTRACT

A decoding device is used to securely send corresponding data gathered from multiple underground sources to multiple users. The device comprises a signal receiving port connected to multiple bandwidth filters and further connected to internet access points that are assigned to end users for secure data access. The invention facilitates allowing the signal and data being transmitted through the formation of the earth to reach end users located nearby and significant distances away from the source of the transmission. A system and method utilizing the decoding device is provided.

20 Claims, 4 Drawing Sheets

Related U.S. Application Data

(60) Provisional application No. 62/819,726, filed on Mar. 18, 2019.

(51) Int. Cl.
*E21B 47/12* (2012.01)
*G01V 3/08* (2006.01)
*G01V 3/18* (2006.01)

(56) References Cited

U.S. PATENT DOCUMENTS

| | | |
|---|---|---|
| 6,937,159 B2 | 8/2005 | Hill et al. |
| 7,080,544 B2 | 7/2006 | Stepanik et al. |
| 7,132,958 B2 | 11/2006 | Dodge et al. |
| 7,748,450 B2 | 7/2010 | Mundell |
| 8,358,220 B2 | 1/2013 | Savage |
| 8,400,236 B2 | 3/2013 | Codazzi |
| 9,459,371 B1 | 10/2016 | Holman et al. |
| 9,683,438 B2 | 6/2017 | Fanini et al. |
| 10,400,585 B2 | 9/2019 | Down et al. |
| 10,972,124 B2 * | 4/2021 | Hill ................... G06T 17/005 |
| 2011/0068796 A1 | 3/2011 | Signorelli et al. |
| 2011/0098931 A1 | 4/2011 | Kosmala et al. |

* cited by examiner

REMOTE DOWNHOLE SIGNAL DECODER AND METHOD FOR SIGNAL RE-TRANSMISSION

CROSS REFERENCE TO RELATED APPLICATIONS

This Non-Provisional patent application claims priority to co-pending United States patent application having the Ser. No. 16/823,325, filed Mar. 18, 2020 which is entitled "REMOTE DOWNHOLE SIGNAL DECODER AND METHOD FOR SIGNAL RE-TRANSMISSION" which claimed priority to United States patent provisional application having the Ser. No. 62/819,726, filed Mar. 18, 2019 which is entitled "REMOTE DOWNHOLE SIGNAL DECODER AND METHOD FOR SIGNAL RE-TRANSMISSION." U.S. patent provisional application Ser. No. 62/819,726 is hereby incorporated by reference. The present application is a U.S. nonprovisional patent application.

STATEMENT REGARDING FEDERALLY FUNDED RESEARCH & DEVELOPMENT

The invention was not funded or developed under a contract with an agency of the U.S. Government.

FIELD OF INVENTION

This invention generally relates to subterranean exploration and production of resources. More specifically, this invention relates to an apparatus and method to decode downhole signals for oil and gas exploration.

BACKGROUND OF THE INVENTION

Many different applications exist where signal, and data carried within this signal, will be transmitted through the earth's formation. Seismic data gathering, geophysical research, earthquake detection and telemetry data from drilling operations being common forms of this type of signal transmission. This invention relates to the improvement of gathering this signal, the efficiency of which it is carried from depth upwardly to the surface of the earth, and lastly the means in which it can be rebroadcast over great distances to where the information is needed.

Specifically, during the drilling of a well or underground bore data that is collected by the downhole measuring tools is transmitted via the earths formation to the surface and received by signal gathering equipment located at the earth's surface or at a very shallow depth typically achieved by installing antenna rods. These rods are generally under 10 feet in length and are connected by cables to the on-site signal decoding hardware. This method has its inherent difficulties and challenges as surface signal is often diluted by the great distance to the underground tool or overcome by the ambient electrical interference of other electrical equipment operating at the surface location, such as the drilling rig itself. One method of overcoming this is by using wire that extends from deep below the earth surface in relatively close range of the downhole transmitting tool and extending to the earth's surface where signal and data can be decoded cleanly. This method is described in detail in U.S. Pat. No. 4,181,014. However once signal is received at the earth's surface via this wire it is often needed to be decoded at a location that is a great distance away from this wireline's surface location point.

Accordingly, there is a need to improve the ability to decode and broadcast and downhole signals This invention satisfies that need.

SUMMARY

In one embodiment, the invention is a device. In a more specific embodiment, the device comprises an input device for sending a plurality of signals to the decoding device; a plurality of frequency filters for segmenting the plurality of signal into specific frequency ranges; a plurality of data access value coders, wherein a specific data access coder is matched to a specific frequency filter handling the specific frequency range; an output device for transmitting multiple signals segmented into specific frequencies; and a power source for operating the decoding device.

In a second embodiment, the invention is a system. In a more specific embodiment, the device comprises at least one device for receiving at least one signal transmitted though the subterranean earth; a decoding device that segments a plurality of received signals and assigns specific frequency ranges access codes from data access coders matched to specific frequency filters and transmits multiple signals segmented into specific frequencies; a network that transmits multiple signals segmented into specific frequencies to at least one end user and; at least one end user that receives the data assigned to the end user based on the signal frequency.

In a third embodiment, the invention is a method. In a more specific embodiment, the method comprises five steps. First is introducing a signal with a specific frequency into a subterranean formation. Second is transmitting the signal received by an underground wireline to a decoding device on the surface. Third is using the decoding device to separate the signal into a specific frequency range and assigning the frequency range an access value. Fourth is transmitting the signal to an end user. Fifth is using the access value to allow the end user to receive the data from the single associated with that access value.

DRAWINGS

The foregoing and other advantages of the present technique may become apparent upon reading the following detailed description and upon reference to the drawings in which.

DETAILED DESCRIPTION OF THE INVENTION

Figure 1:
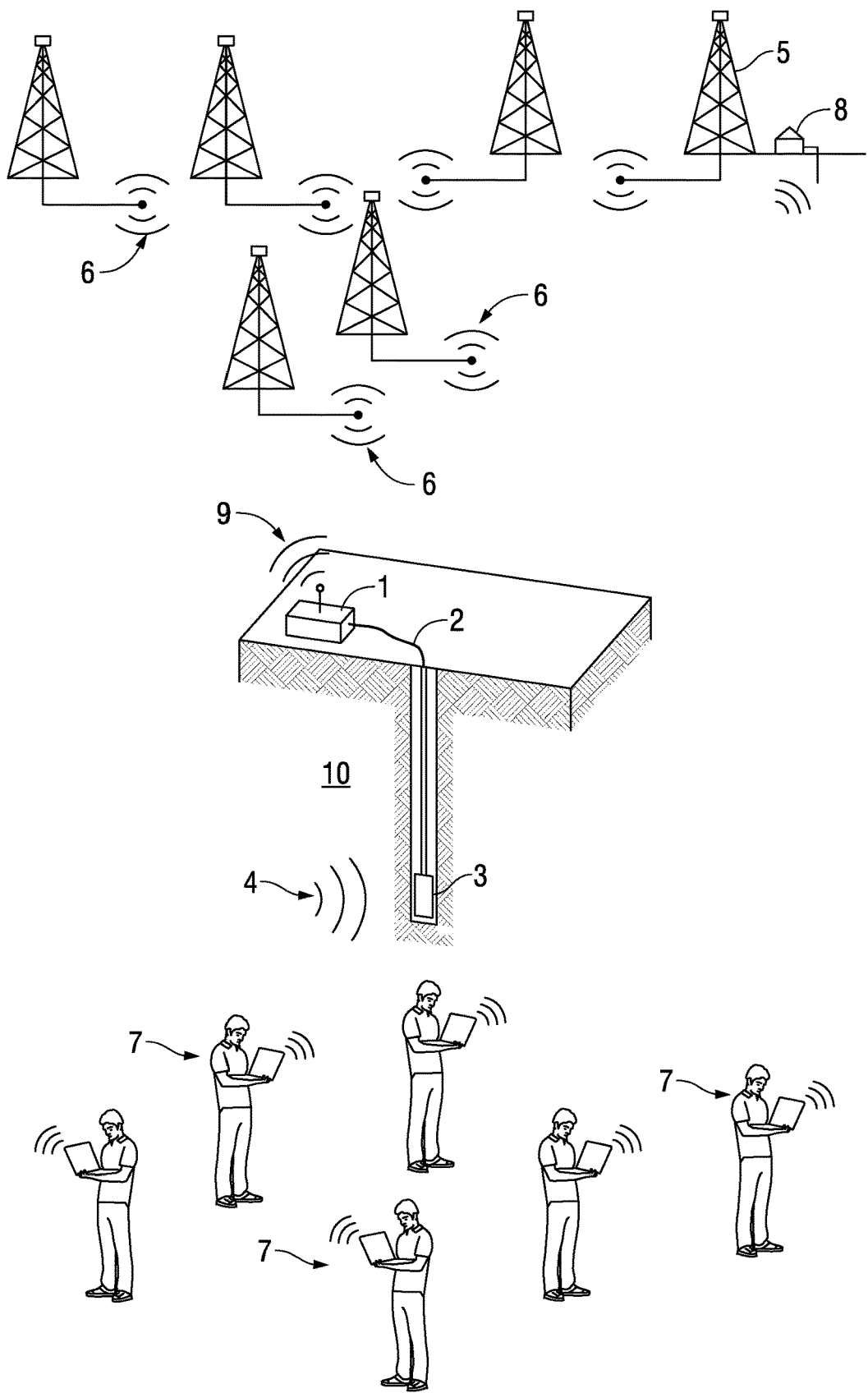
FIG. 1 is a perspective view of an embodiment of the invention in operation.

Below is a description of various embodiments of the invention. Before describing selected embodiments of the present disclosure in detail, it is to be understood that the present invention is not limited to the embodiments described herein. The disclosures and descriptions herein are illustrative and explanatory of one or more presently preferred embodiments and variations thereof. It will be appreciated by those skilled in the art that various changes in the design, organization, means of operation, structures and location, methodology, and use of mechanical equivalents may be made without departing from the spirit of the invention.

The drawings are intended to illustrate and plainly disclose presently preferred embodiments to one of skill in the art but are not intended to be manufacturing level drawings or renditions of final products. These may include simplified conceptual views to facilitate understanding or explanation. In addition, the relative size and arrangement of the components may differ from that shown and still operate within the spirit of the invention.

Moreover, various directions such as "upper", "lower", "bottom", "top", "left", "right", "first", "second" and so forth are made only with respect to explanation in conjunction with the drawings. The inventive components may be oriented differently, for instance, during transportation, manufacturing and operations. Numerous varying and different embodiments and modifications may be made within the scope of the concept(s) embodiments herein taught and described. Therefore, it is to be understood that the details herein are to be interpreted as illustrative and non-limiting. However, the invention can be used to receive, transmit and classify many signals not just geoscience information.

In one embodiment, the invention consists of a decoding device used to securely send corresponding data gathered from multiple underground sources to multiple users. The device comprises a signal receiving port connected to multiple bandwidth filters and further connected to internet access points that are assigned to end users for secure data access. The invention facilitates allowing the signal and data being transmitted through the formation of the earth to reach end users located nearby and up to great distances away from the source of the transmission. The invention enables limited access to individual users so that data security from their prospective transmitting device is preserved. The signal received from multiple sources that are transmitting through the formation of the earth from miles away could be received, filtered by frequency, and rebroadcast through localized networks as well as via the internet to the end users by use of the invention and specialized software.

In another embodiment, this invention is a system that allows for the decoding, rebroadcasting, frequency segmentation, and secure access to that surface signal by multiple parties, from multiple downhole signal generating devices. In a more specific embodiment, the device comprises at least one device for receiving at least one signal transmitted though the subterranean earth; a decoding device that segments a plurality of received signals and assigns specific frequency ranges access codes from data access coders matched to specific frequency filters and transmits multiple signals segmented into specific frequencies; a network that transmits multiple signals segmented into specific frequencies to at least one end user and; at least one end user that receives the data assigned to the end user based on the signal frequency.

In a more specific embodiments of the system include the ability to convert analog signal received from the downhole telemetry source to a digital signal format, transmit that digital signal over great distances via internet connectivity and then be converted back to analog signal at the end users location for signal decoding of a downhole transmitting electromagnetic Measurement-While-Drilling tool.

In an alternative embodiment the system can convert analog signal received from the downhole telemetry source to a digital signal format, transmit that digital signal to nearby locations for wireless connectivity to end users and then be converted back to analog signal at the end users location for signal decoding of a downhole transmitting electromagnetic Measurement-While-Drilling tool. This signal may be transmitted to this nearby location via: wireless internet connection; Bluetooth; wireless ethernet; radio frequency; microwave; or any other means of wireless signal or data transmission as described below.

By using this device and/or system clearer, interference free data could be used from the downhole transmitting sources by users anywhere in the world. Localized signal retrieval methods would no longer be needed and the need for personnel to be assigned to well drilling locations for the purpose of signal retrieval and decoding would no longer exist.

In a more specific embodiment, a complete telemetry system is provided. This system comprises a device for sending an electromagnetic signal; a device for receiving an electromagnetic signal. The signal can come from an electromagnetic device contained in a drill string that is in a subterranean wellbore for transmitting an electromagnetic signal in a geological formation adjacent to the subterranean wellbore. The system can further comprise a cable for bringing the electromagnetic signal to a portion of earth's surface, wherein the cable is connected to the electromagnetic device and the receiver; and a transmitter that can send a plurality of signals to at least one end user.

As shown in FIG. 1, an embodiment of the invention comprises a decoding device 1, typically on the surface of the earth, that is connected to a wireline signal retrieval system 3 as described in U.S. Pat. No. 4,181,014. U.S. Pat. No. 4,181,014 is hereby incorporated by reference. This system uses a wire that extends to the surface of the earth 2 and receives a signal 4 being transmitted through a formation 10 in the subterranean earth.

Figure 2:
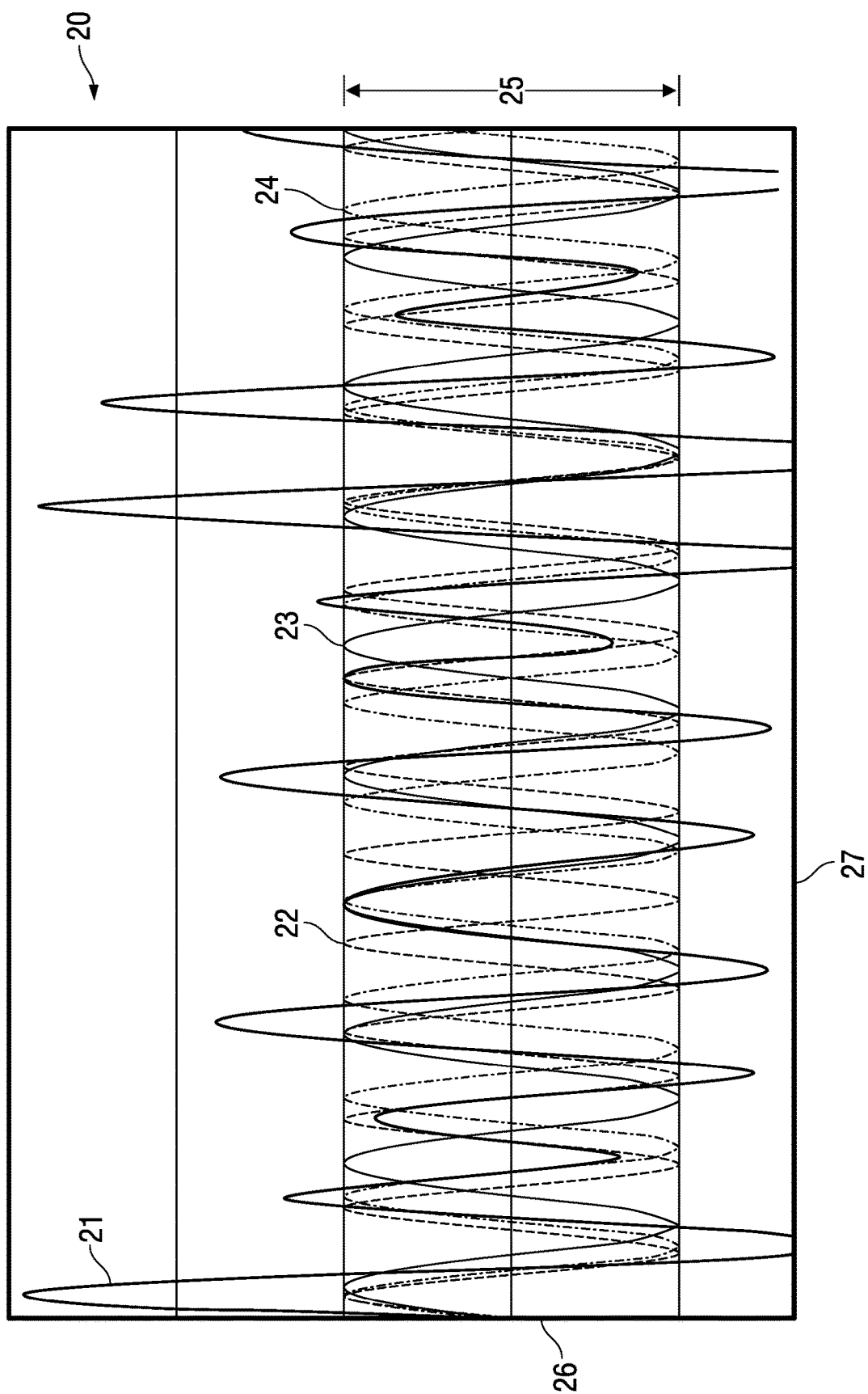
FIG. 2 is a graphic display of an embodiment showing multiple signals being received on a singular decoding device.

FIG. 2 is a graph 20 showing simultaneously received signals of varying frequencies 26 over time 27 that is received on antenna decoding device such as element 1 from FIG. 1. The first, second third and fourth signals are labeled as signal 21, signal 22, signal 23 and signal 24 respectively. As shown in FIG. 2, each of the four received data streams could be made available to individual users in remote locations. Depending on the agreement each user could receive one or more of the signals. Blockchain software can be used to protect the data and make sure each user only receives the data that user is entitled to and the data is transmitted correctly.

In one embodiment, users would request access to the corresponding bandwidth at which their respective tool was transmitting. Using bandwidth filtering and multiple IP address accessing software each of the data streams received at each frequency would be singled out, filtered and cleaned up for rebroadcasting to the end user's remote location. This data processing can be performed onsite and transmitted directly to the use or can be sent to an offsite data processing center.

Figure 3:
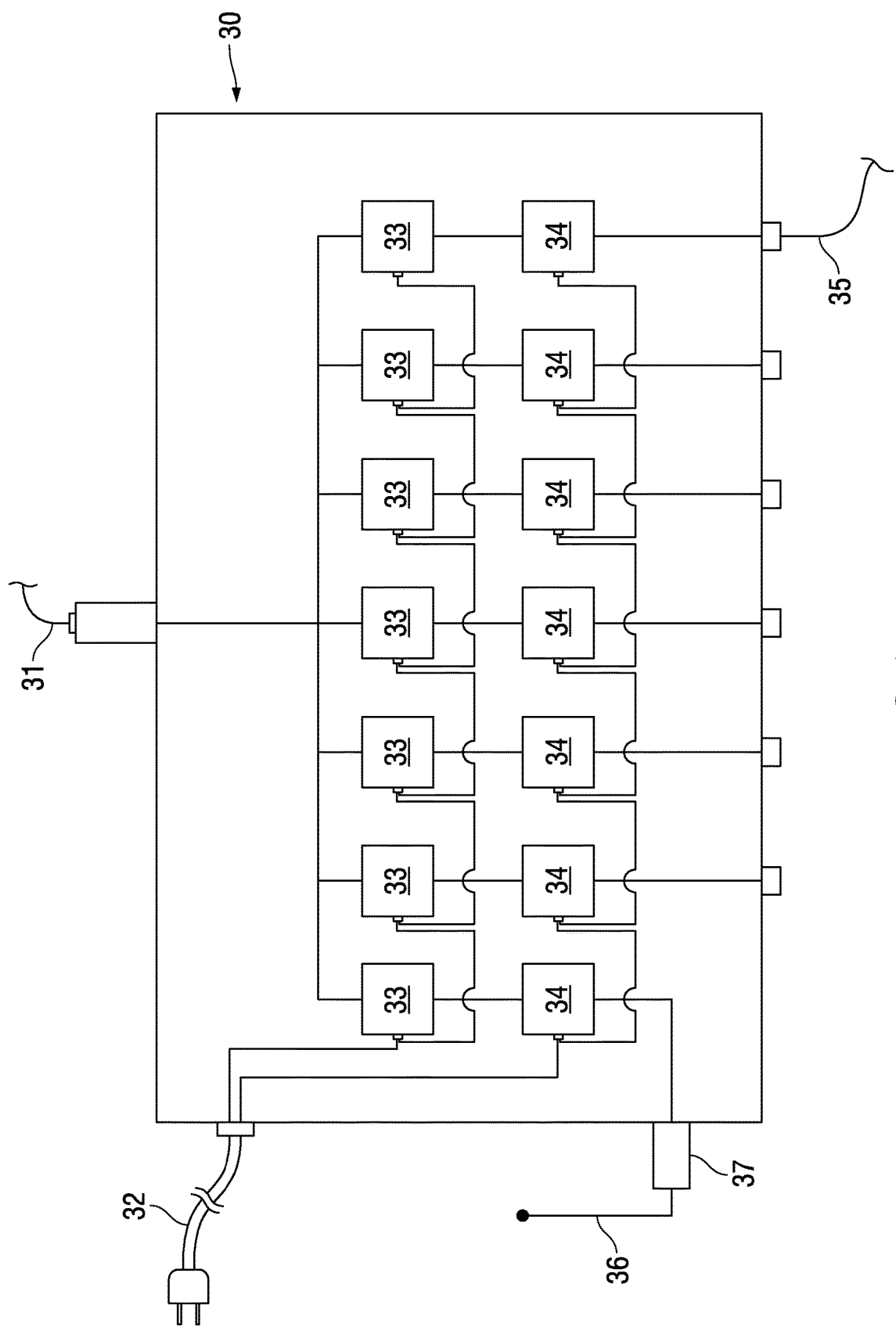
FIG. 3 is a graphic representation of an embodiment showing components contained inside a receiver device.

This signal would typically be received from, but not limited to, drilling rigs 5 in operation nearby, as shown in FIG. 1. During normal drilling operations, electromagnetic (EM) Measurement-While-Drilling (MWD) tools emit a signal 6 into the earths formation 10 that is typically received and decoded on surface by localized antenna rods 8, that may nor may not need to located below the surface and into the subterranean formation. As shown in FIG. 3, in an embodiment of this invention, a decoding device 30 or an electrical signal acquisition device receives raw signal from multiple downhole transmitting devices. These signals are typically received on a common wire extending upward from a downhole receiving source such as, element 2 from FIG. 1) that is connected via wire 31, or other method, to the decoding device 30 which is sometimes called a signal receiving device. There are other telemetry devices and systems that can be utilized to send a signal 4 to the decoding device 30. These devices and systems include but are not limited to radio waves, Bluetooth, other wireless signals, microwaves, ethernet, fiber optics and any combinations thereof.

Typically, the signals used will overlap in frequency, as shown in FIG. 2. These signals are almost always distinguishable from each other in that they are all received into the device at a specific frequency 21 and frequency bandwidth 25 with each individual signal at its own bandwidth representing signal from an individual downhole transmitting device such as an EM MWD tool, such as element 3 from FIG. 1.

FIG. 3 is a graphic representation of component embodiments that may be contained inside a decoding device 30. In a more specific embodiment, the device comprises an input device for sending a plurality of signals to the decoding device; a plurality of frequency filters for segmenting the plurality of signal into specific frequency ranges; a plurality of data access value coders, wherein a specific data access coder is matched to a specific frequency filter handling the specific frequency range; an output device for transmitting multiple signals segmented into specific frequencies; and a power source for operating the decoding device.

Persons skilled in the art may recognize alternative or different components that can be perform the same benefit using the disclosures in this patent application. All such components are intended to be included in the claimed invention.

As shown in FIG. 3, the decoding device 30 may utilize filters 33 or frequency filters or frequency bandwidth filters to separate each overlapping signal received on the common input line or device such as, wire 31. The signal is transmitted through the input device through the frequency bandwidth filters 33 which passes the specific frequency bandwidths to a matched data access coder that assigns each code a specific access value. In one embodiment each of the plurality of frequency bandwidth filters 33 is matched or assigned to one or more specific individually internet protocol (IP) addressed access points 34. The device can utilize specialized software to allow users to access their respective downhole transmitting device by accessing one or more of these points when given login permission. Blockchain software can provide transmission of multiple data frequencies through one or more system and while accurately and reliably ensuring the specific user only receives the data, that user is entitled to.

In alternative embodiment, input signals received from multiple downhole telemetry signal sources can be separated by other means other than by frequency. The separation can be done by frequency, signal type, voltage level; amplitude; any other means of identifying individual signals from one another and combinations thereof. In these alternative embodiments, the frequency filter will be substituted for a filter that can filter and distinguish the signals by signal type, voltage level; amplitude; any other means of identifying individual signals from one another and combinations thereof.

The data will be transmitted by an output device capable of transmitting multiple signals assigned specific access values. The output device can be either an outside internet connection, shown as internet wire 35 or connection or a localized Wi-Fi network, shown as antenna 36 attached to router 37 which can be sent to the end user wither directly or through a network. Data can also be transmitted via satellite, microwave or other suitable communication devices. The device will preferably be independently powered separate from any incoming electrical transmission from a local power source using a power connection 32, such as an outlet plug.

The software used in conjunction with the device can provide one, two or three separate functions either simultaneously or separately. First, the software allows the device to receive multiple overlapping signals from any downhole transmitting device whose transmission is strong enough to reach the wireline connected antenna and be carried to the surface via the wire conductor. Second, once received by the device the software sorts the multiple signal by their carrier frequency. Each downhole device has its own transmission frequency. Using bandwidth filter the signals are separated and the software sends each signal cleanly and without interference to the access point with its individual IP address. During its third function, the software recognizes authorized users by their log in and password confirmation and allows them to access only the bandwidth, or bandwidth, the end user has authority to access. Using blockchain or other types of complex software, the system can handle all three function simultaneously, as needed.

Typically, the bandwidths can be matched to a specific respective tool based on the known transmitting frequencies. For example, as shown FIG. 1, a MWD tool is transmitting a signal 4 that can be picked up by a receiving device 2, such as wireline. The receiving device 2 is also picking up additional signals as well. In this example the MWD tool (not shown) is transmitting the signal 4 at 4 HZ. The bandwidth filter for this particular signal could be set to filter all signals below 3 HZ and above 5 HZ. Thus, leaving only MWD TOOL 4 signal to be rebroadcast. The software will clean the signal from ambient noise leaving only 3-5 HZ signal, it will then allow that signal to be accessed at its specified IP address to the user who has the correct log in for that IP access point via the internet.

As shown in FIG. 1, the combined functions of both the hardware devices as well as the specialized software deployed, multiple users 7 are granted access to data or data logs using only one decoding device. This decoding device can be connected through the internet to, directly or indirectly, transmit the received signal from a respective downhole transmitting tool in operation at the drilling rig site 5 to one or more users 7. This signal and its data contained within will be rebroadcast 9 via the internet or other transmission device such as cellular tower, microwaves or satellite, to anywhere in the world. This device and system eliminate the need for specific surface signal decoding equipment with their localized antenna rods that are typically required at the drilling rig site. One downhole wireline signal retrieval source connected to this invention would replace multiple individual surface signal receivers. This device has been shown to be able to reliably receive, segment and transmit or rebroadcast up to seven independent signals from downhole. In comparison, using a splitter attached to a transmitter tool it would be possible to receive and transmit up to two signals. The ability to transmit two or more signals using one device and preferably at least 3 signals is a significant improvement.

Typically, oil and gas downhole tools such as, electromagnetic signal devices requires a wire that extends from the tool all the way to the surface. The technology disclosed herein enables signals that are being broadcast into the earth formation to be received at the surface without a complete wireline connection. This is done by gathering the telemetry data on an antenna that transfers that signal to surface for further rebroadcasting via wireless transmission to the end users.

Method

In one embodiment, the method requires five steps. First is introducing a signal with a specific frequency into a subterranean formation. Second is transmitting the signal received by an underground wireline to a decoding device on the surface. Third is using the decoding device to separate the signal into a specific frequency range and assigning the frequency range an access value. Fourth is transmitting the signal to an end user. Fifth is using the access value to allow the end user to receive the data from the single associated with that access value.

Figure 4:
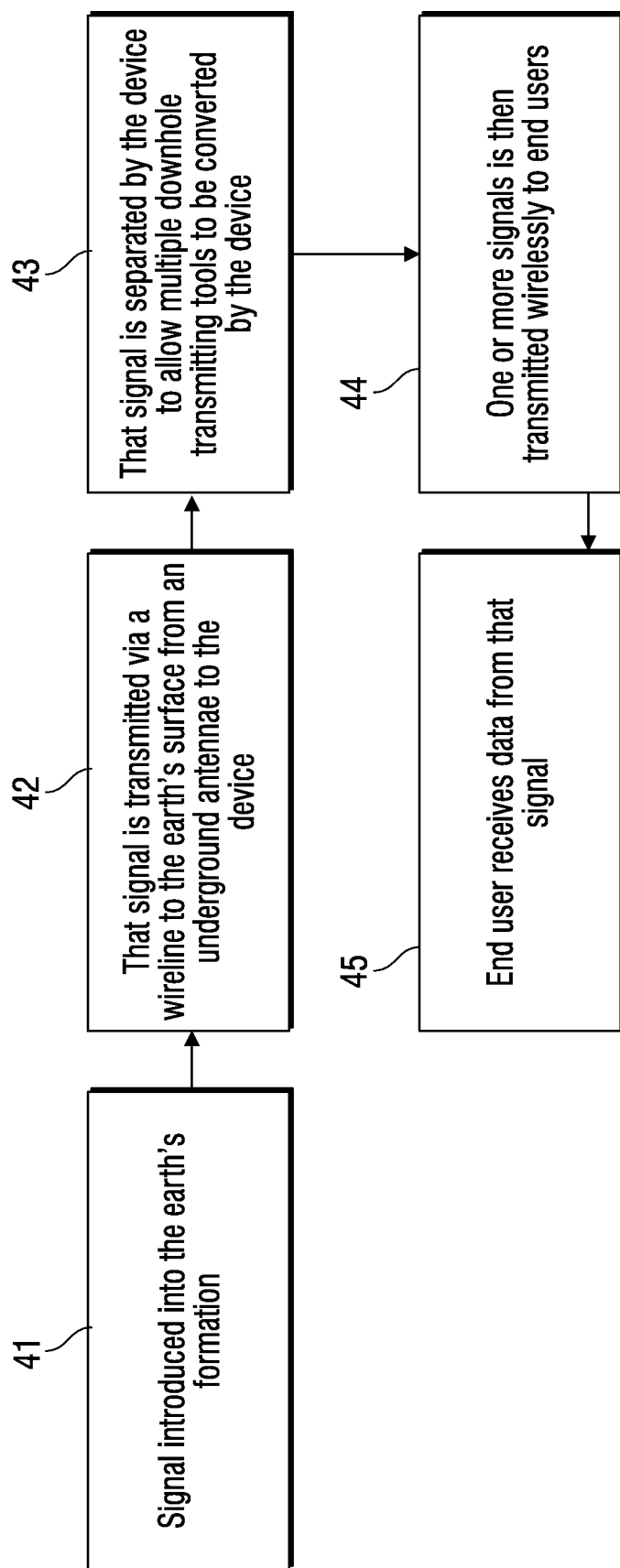
FIG. 4 is a flow chart graph showing a method embodiment of the present invention.

A specific example, which is not meant to be limiting, is shown in FIG. 4. First, a signal is introduced into the earth's formation 41. This is typically from an EM tool located beneath the earth's surface but can be from a seismic device on the earth's surface. Second, that signal is then transmitted through a wireline to the earth's surface from an underground antennae up to the device 42. Third that signal is separated by the device 43. That device can be the decoding device 30, shown in FIG. 3. That decoding device can use bandwidth filters separate multiple signals in specific frequency segments. Alternatively, blockchain software can decode the signal. Each signal can then be associated with a specific transmitting tool such as, EM MWD. The signal can then be converted from analog to digital signal, as needed. Fourth, one or more signals is then transmitted wirelessly to end users 44. As mentioned above, one, two, three or more signals are sent independently or simultaneously by several different methods such as, internet to one or more end user that can be remotely located. Fifth, the end users will then receive the data 45. The end user can then choose to either convert the signal back to analog to be decoded by their own surface decoding signal device or the digital signal can be decoded via software without the need for a secondary decoding device or the conversion back to analog signal. Blockchain can also be utilized to expedite the process and eliminate steps such as, coding, decoding and segmenting the data.

The example device, systems and methods disclosed above are meant to illustrate embodiments of the invention. Persons skilled in the art will recognize many different variations of these examples and disclosures based on the disclosure in this document and known prior art. All variations are intended to be within the scope of this invention. Therefore, the examples and specific embodiments disclosed are not intended to limit the scope of the claims.

We claim:

1. An apparatus comprising:
   a. a wireline for receiving and sending a plurality of signals to a decoding device;
   b. a plurality of bandwidth filters in the decoding device for segmenting the plurality of signals into specific bandwidth ranges;
   c. a plurality of data access value coders, wherein a specific data access coder is matched to a specific bandwidth filter handling the specific bandwidth range;
   d. an output device for transmitting multiple signals segmented into specific bandwidths; and
   e. a power source for operating the decoding device.

2. The decoding device of claim 1, wherein at least one of the plurality of signals is from an electromagnetic device in a subterranean portion of earth.

3. The decoding device of claim 1, wherein at least one of the plurality of signals is from a Measurement-While-Drilling device on a drill string in a wellbore.

4. The decoding device of claim 1, wherein the output device for transmitting multiple signals is segmented into specific bandwidths and is sent using the output device transmitting via wireless internet connection, Bluetooth, wireless ethernet, radio, microwave and combinations thereof.

5. The decoding device of claim 1, further comprising at least one additional filter for segmenting the plurality of signals based on signal type, frequency voltage level, amplitude, and combinations thereof.

6. The decoding device of claim 1, further comprising at least one device for converting the plurality of signals from an analog signal to a digital signal.

7. A system comprising:
   a. at least one wireline device for receiving and sending a plurality of signals, transmitted though subterranean earth, to a decoding device;
   b. the decoding device that segments a plurality of received signals and assigning specific bandwidth ranges access codes from data access coders matched to specific bandwidth filters and transmitting multiple signals segmented into specific bandwidths;
   c. a network that transmits multiple signals segmented into specific bandwidths to at least one end user; and
   d. an end user receiving device wherein the at least one end user receives the data assigned to the end user based on the signal bandwidths.

8. The system of claim 7, wherein the at least one signal is from an electromagnetic device in the subterranean earth.

9. The system of claim 7, wherein the at least one signal is from a Measurement-While-Drilling device on a drill string in a wellbore.

10. The system of claim 7, wherein the at least one signal is segmented into a specific bandwidth using the decoding device and transmitted via wireless internet connection, Bluetooth, wireless ethernet, radio, microwave and combinations thereof.

11. The system of claim 7, wherein the decoding device further comprising at least one additional filter for segmenting the plurality of signals based on signal type, frequency, voltage level, amplitude and combinations thereof.

12. The system of claim 7, wherein the decoding device, further comprising at least one device for converting the plurality of signals from an analog signal to a digital signal.

13. A method comprising:
    a. introducing a signal with a specific bandwidth into a subterranean formation;
    b. transmitting the signal received by an underground wireline to a decoding device on the surface;
    c. using the decoding device to separate the signal into a specific bandwidth range and assigning the specific bandwidth range an access value;
    d. transmitting the signal to an end user; and
    e. using the access value to allow the end user to receive the data from the signal associated with that access value.

14. The method of claim 13, wherein the signal is from an electromagnetic device in the subterranean formation.

15. The method of claim 13, wherein the signal is from a Measurement-While-Drilling device on a drill string in a wellbore.

16. The method of claim 13, wherein the signal is segmented into a specific bandwidth using the decoding device and transmitted via wireless internet connection, Bluetooth, wireless ethernet, radio frequency, microwave and combinations thereof.

17. The method of claim 13, wherein the decoding device further comprises at least one additional filter for segmenting the plurality of signals based on signal type, voltage level, amplitude, and combinations thereof.

18. The method of claim 13, further comprising converting the plurality of signals from an analog signal to a digital signal.

19. The method of claim 13, further comprising converting the signal from digital to analog by the end user.

20. The method of claim 13, further comprising additional filtering by the end user.

* * * * *